United States Patent
Lecamp et al.

(10) Patent No.: US 8,786,176 B2
(45) Date of Patent: Jul. 22, 2014

(54) SUBSTRATE FOR ORGANIC LIGHT-EMITTING DEVICE, AND ALSO ORGANIC LIGHT-EMITTING DEVICE INCORPORATING IT

(75) Inventors: Guillaume Lecamp, Paris (FR); François-Julien Vermersch, Paris (FR); Svetoslav Tchakarov, Arcueil (FR); Hadia Gerardin, Paris (FR); Alessandro Giassi, Paris (FR)

(73) Assignee: Saint-Gobain Glass France, Courbevoie (FR)

( * ) Notice: Subject to any disclaimer, the term of this patent is extended or adjusted under 35 U.S.C. 154(b) by 761 days.

(21) Appl. No.: 12/810,490

(22) PCT Filed: Dec. 23, 2008

(86) PCT No.: PCT/FR2008/052412
§ 371 (c)(1),
(2), (4) Date: Sep. 28, 2010

(87) PCT Pub. No.: WO2009/083693
PCT Pub. Date: Jul. 9, 2009

(65) Prior Publication Data
US 2011/0037379 A1  Feb. 17, 2011

(30) Foreign Application Priority Data
Dec. 27, 2007  (FR) .................................... 07 09146

(51) Int. Cl.
*H05B 33/00* (2006.01)
*H01J 1/88* (2006.01)

(52) U.S. Cl.
USPC .......................................... 313/503; 313/292

(58) Field of Classification Search
USPC .......... 313/502–510, 292; 428/432, 697, 699, 428/701–702, 336
See application file for complete search history.

(56) References Cited

U.S. PATENT DOCUMENTS

| 4,649,432 A | 3/1987 | Watanabe et al. |
| 5,280,373 A | 1/1994 | Ozawa et al. |

(Continued)

FOREIGN PATENT DOCUMENTS

| DE | 197 33 053 A1 | 2/1999 |
| DE | 20 2005 000 979 | 7/2006 |

(Continued)

OTHER PUBLICATIONS

Kloeppel, A., et al., "Dependence of the electrical and optical behaviour of ITO-silver-ITO multilayers on the silver properties", Thin Solid Films, Elsevier, vol. 365, No. 1, pp. 139-146, Apr. 1, 2000.

(Continued)

*Primary Examiner* — Anh Mai
*Assistant Examiner* — Brenitra M Lee
(74) *Attorney, Agent, or Firm* — Pillsbury Winthrop Shaw Pittman LLP

(57) ABSTRACT

A substrate for an organic light-emitting device, includes a transparent substrate having an optical index n0, bearing, on a first main face, a first transparent or semi-transparent coating of an electrode, referred to as the lower electrode, with a sheet resistance less than or equal to 6Ω/□ and which includes the following stack of layers: an anti-reflection sublayer having a given optical thickness L1 and having an optical index n1 such that the ratio of n1 to n0 is greater than or equal to 6/5; a first metallic layer having a given thickness e1; a first separating layer, having a given optical thickness L2; a second metallic layer, having an intrinsic electrical conductivity property, and having a given thickness e2; and an overlayer for adapting the work function, L1 being between 20 nm and 120 nm, L2 between 75 nm and 200 nm, and the sum of the thicknesses e1+e2 of the first and second metallic layers being less than or equal to 40 nm.

37 Claims, 2 Drawing Sheets

(56) References Cited

U.S. PATENT DOCUMENTS

| | | | |
|---|---|---|---|
| 5,346,770 | A | 9/1994 | Osada et al. |
| 5,667,853 | A | 9/1997 | Fukuyoshi et al. |
| 5,962,115 | A | 10/1999 | Zmelty et al. |
| 6,014,196 | A | 1/2000 | Anzaki et al. |
| 6,040,056 | A | 3/2000 | Anzaki et al. |
| 6,045,896 | A | 4/2000 | Boire et al. |
| 6,414,431 | B1 | 7/2002 | Yu et al. |
| 6,489,045 | B1 | 12/2002 | Araki et al. |
| 7,049,757 | B2 | 5/2006 | Foust et al. |
| 7,161,171 | B2 | 1/2007 | Dahmani et al. |
| 2002/0008286 | A1 | 1/2002 | Yamazaki et al. |
| 2003/0049464 | A1 | 3/2003 | Glenn et al. ................ 428/432 |
| 2003/0162333 | A1 | 8/2003 | Kim et al. |
| 2003/0186064 | A1 | 10/2003 | Murata et al. |
| 2004/0001915 | A1 | 1/2004 | He et al. |
| 2004/0031957 | A1 | 2/2004 | Tyan |
| 2004/0032220 | A1 | 2/2004 | Cok et al. |
| 2004/0081855 | A1 | 4/2004 | Kim et al. |
| 2004/0113146 | A1 | 6/2004 | Dahmani et al. |
| 2004/0149984 | A1 | 8/2004 | Tyan et al. |
| 2004/0245918 | A1 | 12/2004 | Lee |
| 2005/0000564 | A1 | 1/2005 | Sato et al. |
| 2005/0073228 | A1 | 4/2005 | Tyan et al. .................... 313/110 |
| 2005/0073251 | A1 | 4/2005 | Kato |
| 2005/0124257 | A1 | 6/2005 | Maeuser |
| 2005/0162071 | A1 | 7/2005 | Lee et al. |
| 2005/0199904 | A1 | 9/2005 | Yamamoto |
| 2005/0264185 | A1 | 12/2005 | Hoffmann .................... 313/504 |
| 2006/0043886 | A1 | 3/2006 | Lee et al. |
| 2006/0091791 | A1 | 5/2006 | Shin |
| 2006/0124933 | A1 | 6/2006 | Kang |
| 2006/0152833 | A1 | 7/2006 | Halls et al. |
| 2006/0209551 | A1 | 9/2006 | Schwenke et al. |
| 2006/0269786 | A1 | 11/2006 | Shin et al. |
| 2006/0290841 | A1 | 12/2006 | Kwon et al. |
| 2007/0206263 | A1 | 9/2007 | Neuman et al. |
| 2008/0100202 | A1 | 5/2008 | Cok |
| 2010/0072884 | A1 | 3/2010 | Tchakarov et al. |
| 2010/0117523 | A1 | 5/2010 | Tchakarov |
| 2010/0225227 | A1 | 9/2010 | Tchakarov et al. |

FOREIGN PATENT DOCUMENTS

| | | |
|---|---|---|
| EP | 0 733 931 | 9/1996 |
| EP | 0 747 330 | 12/1996 |
| EP | 0 847 965 | 6/1998 |
| EP | 1 329 307 A | 7/2003 |
| EP | 1 396 676 | 3/2004 |
| EP | 1 403 939 A | 3/2004 |
| EP | 1 521 305 | 4/2005 |
| EP | 1 693 483 | 8/2006 |
| EP | 1 717 876 | 11/2006 |
| FR | 2 844 136 A | 3/2004 |
| JP | 10-100303 | 4/1998 |
| JP | 10-217378 | 8/1998 |
| JP | 11-070610 | 3/1999 |
| JP | 2001-243840 A | 9/2001 |
| JP | 2002-015623 | 1/2002 |
| JP | 2002-313139 | 10/2002 |
| JP | 2002-313572 | 10/2002 |
| WO | WO 99/02017 | 1/1999 |
| WO | WO 2004/025334 A | 3/2004 |
| WO | WO 2004/057674 | 7/2004 |
| WO | WO 2005/041620 | 5/2005 |
| WO | WO 2005/053053 | 6/2005 |
| WO | WO 2006/013373 A | 2/2006 |
| WO | WO 2007/096565 | 8/2007 |

OTHER PUBLICATIONS

Jung, Yeon Sik, et al., "Effects of thermal treatment on the electrical and optical properties of silver-based indium tin oxide/metal/indium tin oxide structures", Thin Solid Films, Elsevier, vol. 440, No. 1-2, pp. 278-284, Sep. 1, 2003.

International Preliminary Report on Patentability as issued for PCT/FR2008/052412, dated Sep. 7, 2010.

C.H. Jeong, et al., "Four-wavelength white organic light-emitting diodes using 4,4'-bis-[carbazoyl-(9)]-stilbene as a deep blue emissive layer", Organic Electronics 8, 2007, pp. 683-689.

International Search Report as issued for PCT/FR2008/052412, dated Oct. 29, 2009.

SUBSTRATE FOR ORGANIC LIGHT-EMITTING DEVICE, AND ALSO ORGANIC LIGHT-EMITTING DEVICE INCORPORATING IT

CROSS-REFERENCE TO RELATED APPLICATIONS

This application is the U.S. National Stage of PCT/FR2008/052412, filed Dec. 23, 2008, which in turn claims priority to French Application No. 0709146, filed Dec. 27, 2007. The content of both applications are incorporated herein by reference in their entirety.

The subject of the present invention is a substrate for organic light-emitting device and also an organic light-emitting device incorporating it.

Known organic light-emitting systems or OLEDs (organic light-emitting diodes) comprise one or more organic electroluminescent materials supplied with electricity by electrodes, generally in the form of two electroconductive layers, flanking this or these materials.

These electroconductive layers commonly comprise a layer based on indium oxide, generally tin-doped indium oxide better known by the abbreviation ITO. ITO layers have been particularly studied. They can be easily deposited by magnetron sputtering, either from an oxide target (non-reactive sputtering), or from a target based on indium and on tin (reactive sputtering in the presence of oxygen-type oxidizing agent) and their thickness is around 100 to 150 nm. However, this ITO layer has a certain number of drawbacks. Firstly, the material and the high-temperature (350° C.) deposition process for improving the conductivity incur additional costs. The sheet resistance remains relatively high (of the order of 10Ω/□) unless the thickness of the layers is increased to greater than 150 nm, thereby resulting in a reduction in transparency and an increase in the surface roughness, which is critical for OLEDs.

Furthermore, for uniform illumination over large areas it is necessary to form a discontinuous lower electrode, typically by forming electrode zones of a few mm$^2$ and to drastically reduce the distance between each electrode zone, typically by the order of about ten microns. And, in order to do this, use is especially made of expensive and complex photolithography and passivation techniques.

Therefore, novel electrode structures are developed using a metallic thin film in place of the ITO in order to manufacture OLED devices that emit a substantially white light for the illumination.

An organic light-emitting device is known, for example, from document US 2005/0073228A1 that emits a substantially white light, which device is provided with an electrode, commonly called a lower or bottom electrode, which is composed of the stack of the following layers:
  an absorption-reduction sublayer;
  a thin semi-reflective metallic layer such as, for example, a 22.5 nm silver layer;
  an overlayer made of a transparent conductive material such as ITO.

The upper electrode is, itself, composed of a thin reflective and opaque metallic layer such as, for example, a 75.5 nm silver layer.

These two metallic layers form a Fabry-Pérot type microcavity that induces an emission spectrum of the OLED device centred about a wavelength of given resonance.

Since this emission spectrum is strongly dependent on the angle of observation, the OLED device also comprises an optical element capable of reducing this angular dependence by forming a single broadband emission spectrum in the visible.

This optical element is a total-internal-reflection-frustrating system ("TIRF" or total-internal-reflection-frustrater), which is arranged beneath the lower electrode or on the opposite face of the substrate. It is, for example, in the form of a Teflon foil.

The objective that the invention sets itself is to provide an OLED device which, while limiting the angular dependence of the polychromatic emission spectrum in the visible region, is of simpler and/or more efficient design.

It is a question of developing, in particular, an OLED device that is most especially suitable in general (architectural and/or decorative) illumination applications, and/or backlighting applications, and/or signing applications, and this being for any size.

For this purpose, a first subject of the invention is a substrate for an organic light-emitting device, comprising a transparent substrate having an optical index n0, bearing, on a first main face, a first transparent or semi-transparent coating of an electrode, known as the lower electrode, which comprises the following stack of layers:
  an anti-reflection sublayer having a given optical thickness L1 and having an optical index n1 such that the ratio of n1 to n0 is greater than or equal to 6/5;
  a first metallic layer having a given thickness e1, (thus forming a first reflector);
  a first separating layer, having a given optical thickness L2, positioned on the first metallic layer;
  a second metallic layer, having an intrinsic electrical conductivity property thus forming a second reflector) and having a given thickness e2, this second metallic layer being positioned on the first separating layer; and
  an overlayer for adapting the work function, this overlayer being positioned on the second metallic layer and having a given thickness e3.

Moreover, in accordance with the invention:
  L1 is between 20 nm and 120 nm;
  L2 is between 75 nm and 200 nm, in particular between 160 nm and 200 nm;
  the sum of the thicknesses e1+e2 of the first and second metallic layers is less than or equal to 40 nm, and preferably less than or equal to 25 nm in order to reduce the absorption.
  the lower electrode has a sheet resistance less than or equal to 60Ω/□.

Thus, the choice of an electrode structure comprising at least two metallic layers combined with the judicious choice of the optical thicknesses L1 and L2 makes it possible to significantly reduce the colour variation as a function of the angle of observation.

More precisely, the presence of two metallic layers in the first electrode (lower electrode, which is the electrode closest to the substrate) makes it possible to create, once the OLED device is complete, microcavities that resonate (respectively between the first thin metallic layer and the second electrode, and between the second thin metallic layer and the second electrode) at two different wavelengths in the visible region that are sufficiently spaced apart, (preferably spaced at least 100 nm, or even 200 nm apart), for example one at 450 nm and the other at 650 nm. By correctly adjusting the range of L1 and L2 values in accordance with the invention (which amounts to adjusting the optical distances of the two microcavities), these two peaks are broadened to form a single broadband spectrum in the visible region.

The targeted spectrum may be either a spectrum that is substantially "flat" in the visible region, producing a (quasi) pure white light, or any other spectrum, especially those corresponding to the specifications in the fields of backlighting and illumination: spectrum of the illuminant A ("yellow" light) defined at 0° by the coordinates (0.45; 0.41) in the CIE XYZ 1931 chromaticity diagram, spectrum of the illuminant E ("white" light) defined at 0° by the coordinates (0.33; 0.33) in the CIE XYZ 1931 chromaticity diagram, etc.

Preferably, in order to have optimal colour rendition, the resonances obtained by the choice of L1 and L2 do not greatly attenuate, via interference effects, one or the colours of the emission spectrum of the emitting layers of the OLED system. For example, the attenuation may be less than 70%, or even less than or equal to 50%.

Advantageously, in order to limit the angular dependence as much as possible:
- L1 is less than or equal to 100 nm, more preferably still less than or equal to 80 nm; and/or
- L1 is greater than or equal to 40 nm, more preferably still greater than or equal to 50 nm; and/or
- L2 is less than or equal to 160 nm, or even 130 nm; and/or
- L2 is greater than or equal to 90 nm; and/or
- L1 is less than L2, in particular L1 is at least greater than or equal to 1.5L1 or even 1.65L1 and preferably less than 2.5L1 or even less than 2L1.

The electrode is not optimized in order to be as transparent as possible but in order to produce the microcavities suitable for broadband emitters.

Furthermore, surprisingly, the addition of a second silver layer barely impairs the extraction efficiency into the air of the optical radiation emitted by the OLED device, that is to say, the proportion of optical power exiting into the air relative to the total optical power emitted by the source.

The OLED device equipped with such an electrode is simple, compact reliable, robust and does not depend on an additional functional element as in the solution described in document US 2005/0073228A1. It is however possible to further increase the light extraction of the OLED device according to the invention by adding this functional element described in document US 2005/0073228A1 (volume- or surface-scattering layer, Teflon foil, etc).

The electrode according to the invention may extend over a large surface area, for example a surface area greater than or equal to 0.02 $m^2$, or even greater than or equal to 0.5 $m^2$ or greater than or equal to 1 $m^2$.

The electrode according to the invention retains satisfactory electroconductivity properties, or even improves them when the first separating layer is not insulating.

The term "layer", within the meaning of the present invention, should be understood to mean that there may be a layer made of a single material (monolayer) or several layers (multilayer), each made of a different material.

Within the meaning of the present invention, unless otherwise indicated, the thickness corresponds to the geometric thickness.

Within the meaning of the present invention, the expression "based on" is usually understood to mean a layer predominantly containing material in question, that is to say, containing at least 50% of this material in bulk.

Within the meaning of the present invention, the expression "is between" is naturally understood to mean the limiting values indicated.

In the present invention, reference is made to a subjacent layer "x", or to a layer "x" beneath another layer "y", this naturally implies that the layer "x" is closer to the substrate than the layer "y".

For the optical indices n0, n1, the value at 550 nm may be chosen.

It being possible for the anti-reflection sublayer (like the first separating layer) to be a multilayer, the optical thickness L1 (or L2) is naturally the sum of the optical thicknesses of each layer in question, and the optical index n1 is the index of the multilayer. The sum is therefore taken, for all the layers, of the product: layer thickness multiplied by layer optical index.

Naturally, the anti-reflection sublayer (optional base layer and/or optional smoothing layer, and/or contact layer) and the first separating layer (optional additional layer and/or optional smoothing layer and/or contact layer) are preferably (essentially) dielectric (i.e. non-metallic).

Naturally, the anti-reflection sublayer, the first separating layer and the overlayer are preferably composed of thin layers.

Preferably, the first and/or the second metallic layer may be:
- based on a pure material chosen, as first choice, from silver, gold, aluminium or copper, or, as second choice, from other less conductive metals such as molybdenum;
- or based on one of the aforementioned materials, alloyed or doped with at least one other material chosen from: Ag, Au, Pd, Al, Pt, Cu, Zn, Cd, In, Si, Zr, Mo, Ni, Cr, Mg, Mn, Co or Sn, in particular is based on an alloy of silver and of palladium and/or of gold and/or of copper, for improving the moisture resistance of the silver.

The first metallic layer may, in particular, be made of molybdenum especially when it does not contribute to the electrical conductivity of the electrode.

The first and second metallic layers may be made of one and the same material.

In one preferred design, the first and second metallic layers are based on silver (i.e. made of pure silver or made of a metal alloy that contains mainly silver) and optionally:
- the thickness e1 is less than or equal to 15 nm, in particular between 6 and 15 nm, or even less than or equal to 13 nm, and/or less than or equal to 13 nm; and/or
- the thickness e2 is less than or equal to 15 nm, in particular between 6 and 15 nm, or even less than or equal to 7 nm, and/or greater than or equal to 10 nm; and/or
- the thickness e1 is greater than the thickness e2 (from 1 to a few nanometers).

Naturally, the first and/or the second metallic layer may be a multi-metallic layer.

Advantageously, the lower electrode according to the invention may have:
- a sheet resistance less than or equal to 3Ω/□ especially for a (functional) second metallic layer thickness starting from 6 nm and optionally a first metallic layer thickness, also chosen as functional, starting from 6 nm; and/or
- a light transmission $T_L$ greater than or equal to 50% and preferably between 60% and 90%, or even more if that does not impair the performances of the OLED.

Naturally, the electrode may comprise a sequence of layers, optionally repeated one or more times, between the second metallic layer and the overlayer, the sequence being formed:
- from another separating layer, made of a material such as those listed for the first separating layer, optionally made of one and the same material as the first separating layer and/or having an optical thickness in the range given for the first separating layer, and that is preferably conductive;
- surmounted (directly or indirectly) by another metallic layer, made of a material such as those listed for the metallic layers, optionally made of one and the same material as the second metallic layer, in particular that is based on silver.

It may then be preferred for the sum of the thicknesses of the metallic layers to be less than or equal to 40 nm.

The anti-reflection sublayer may comprise one or more layers that do not interfere with the anti-reflection function, especially when this layer or these layers each have a small thickness, typically less than 10 nm, and, for example, an optical index close to that of the substrate.

Preferably, the anti-reflection sublayer may have at least one of the following features:
- it may preferably be deposited directly on the substrate; and/or
- be a monolayer, bilayer, trilayer; and/or
- it has an optical index n1 greater than or equal to 1.8, or even 2, in particular for a substrate having an optical index around 1.5, or high index substrate; and/or
- the majority, or even the whole set, of the layers forming the anti-reflection sublayer (or even the whole set of layers between the substrate and the first metallic layer) has an optical index n1 greater than or equal to 1.8, or even 2; and/or
- the whole set of layers between the substrate and the first metallic layer has an optical thickness less than or equal to 120 nm; and/or
- it comprises a base layer, that is to say a layer closest to the substrate, preferably substantially covering said main face of the substrate and preferably forming a barrier to alkali metals (if necessary) and/or a(n) (dry and/or wet) etch-stop layer and/or a smoothing layer.

By way of example of a base layer, mention may be made of a titanium oxide or tin oxide layer.

A base layer that forms a barrier to alkali metals (if necessary) and/or an etch-stop layer may preferably be:
- based on silicon oxycarbide (of general formula SiOC);
- based on silicon nitride (of general formula $Si_xN_y$), most particularly based on $Si_3N_4$;
- based on silicon oxynitride (of general formula $Si_xO_yN_z$);
- based on silicon oxycarbonitride (of general formula $Si_xO_yN_zC_w$);
- or even based on silicon oxide (of general formula $Si_xO_y$), for thicknesses below 10 nm.

Other oxides and/or nitrides may also be chosen, in particular:
- niobium oxide ($Nb_2O_5$);
- zirconium oxide ($ZrO_2$);
- titanium oxide ($TiO_2$);
- aluminium oxide ($Al_2O_3$);
- tantalum oxide ($Ta_2O_5$);
- or else aluminium, gallium or silicon nitrides and mixtures thereof, optionally Zr-doped.

It is possible that the nitridation of the base layer is slightly sub-stoichiometric.

The base layer may thus be a barrier to the alkali metals subjacent to the electrode. It protects the optional superjacent layer(s), especially a contact layer beneath the first metallic layer, from any contamination (contamination that may result in mechanical defects, such as delaminations); it also preserves the electrical conductivity of the first metallic layer. It also prevents the organic structure of an OLED device from being contaminated by the alkali metals that in fact considerably reduce the lifetime of the OLED.

The migration of alkali metals may occur during fabrication of the device, resulting in a lack of reliability, and/or after fabrication, reducing its lifetime.

The base layer may improve the bonding properties of the contact layer without appreciably increasing the roughness of the entire stack of layers, even in the case of one or more layers being interposed between the base layer and the contact layer (smoothing layer, etc).

The base layer is optionally doped, especially in order to increase its index. The base layer may preferably have a thickness greater than or equal to 3 nm, or even 5 nm.

To obtain a desired optical thickness L1, it is possible to choose an anti-reflection sublayer for which at least half, or even 60% or more, of its geometric thickness is composed of the base layer. This may especially be:
- a layer of $Si_xN_y$ ($Si_3N_4$ in particular), alone or in a base stack;
- of $SnO_2$ alone or in an $Si_xN_y/SnO_2$ type base stack;
- or even of $TiO_2$, alone or in an $Si_xN_y/SnO_2$ type base stack, $TiO_2$ optionally being limited in thickness due to its high optical index.

The anti-reflection sublayer may preferably comprise an etch-stop layer, in particular a layer based on tin oxide.

Most particularly, for the sake of simplicity, the etch-stop layer may be part of or be the base layer: it may preferably be based on silicon nitride or it may be a layer that is based on silicon oxide or based on silicon oxynitride or based on silicon oxycarbide or else based on silicon oxycarbonitride and with tin for reinforcement by anti-etching property, namely a layer of general formula SnSiOCN.

The etch-stop layer is used to protect the substrate in the case of a chemical etching or a reactive plasma etching operation.

By virtue of the etch-stop layer, the base layer remains present even in etched ("patterned") zones. Also, the migration of alkali metals, via an edge effect, between the substrate in an etched zone and an adjacent portion of electrode (or even an organic structure) may be stopped.

A base/etch-stop layer (mainly) made of doped or undoped silicon nitride $Si_3N_4$ may be most particularly preferred. Silicon nitride is deposited very rapidly and forms an excellent barrier to alkali metals.

The first metallic layer, in particular based on silver, may preferably be deposited in a crystalline form on a thin dielectric (non-metallic) layer, called the first contact layer, which is also preferably crystalline.

Alternatively or cumulatively, the second metallic layer, in particular based on silver, may preferably be, deposited in a crystalline form on a thin dielectric (non metallic) layer, called the second contact layer, which is also preferably crystalline.

A contact layer favours the suitable crystalline orientation of the metallic layer deposited thereon.

The first and/or the second contact layer is, preferably, based on at least one of the following metal oxides, optionally doped: chromium oxide, indium oxide, zinc oxide optionally sub-stoichiometric, aluminium oxide, titanium oxide, molybdenum oxide, zirconium oxide, antimony oxide, tin oxide, tantalum oxide or silicon oxide (for simplification, silicon is considered here to be a metal).

Doping is generally understood as introducing a presence of the element in an amount of less than 10% by weight of metallic element in the layer and; the expression "based on" thus covers doping. The metal oxide may be doped in particular between 0.5 and 5% with, for example, an F- or S-doped tin oxide.

As the first contact layer $TiO_2$, ITO, IZO (based on indium and zinc), IGZO (based on indium, gallium and zinc), or even $Sn_xZn_yO_z$ may in particular be chosen.

As the second contact layer ITO, IZO, IGZO, or even $Sn_xZn_yO_z$ may in particular be chosen.

The first and/or the second contact layer may preferably be based on zinc oxide doped with Al (AZO), Ga (GZO), or even with B, Sc, or Sb for a better stability of the deposition process. Moreover, a layer of zinc oxide $ZnO_x$, preferably with x less than 1, more preferably still between 0.88 and 0.98, especially from 0.90 to 0.95, is preferred.

The first and/or the second contact layer may also be based on a metal nitride, in particular $Si_3N_4$ or AlN, or else GaN, InN (generally more expensive). The first contact layer may then merge with the base layer, in particular when the base layer is based on silicon nitride.

Furthermore, to favour the injection of current and/or limit the value of the operating voltage, provision may preferably be made so that:

the first separating layer is composed of layer(s) (apart from the thin blocking layer described later) having an electrical resistivity (in the bulk state, as known in the literature) less than or equal to $10^7$ ohm·cm, preferably less than or equal to $10^6$ ohm·cm, or even less than or equal to $10^4$ ohm·cm;

and/or the anti-reflection sublayer (and/or the overlayer) is composed of layer(s) (apart from the thin blocking layer described later) having an electrical resistivity (in the bulk state, as known in the literature) less than or equal to $10^7$ ohm·cm, preferably less than or equal to $10^6$ ohm·cm, or even less than or equal to $10^4$ ohm·cm.

It is thus possible, for example, to exclude one or more layers (at the very least having a (total) thickness greater than or equal to 15 nm, or even greater than or equal to 10 nm, even 5 nm) based on silicon nitride, silicon oxide, silicon oxynitride, silicon oxycarbide, based on silicon oxycarbonitride, or else based on titanium oxide.

The first and/or second metallic layers may preferably be deposited directly on their contact layer (without taking into account the underblocking layer(s) described later).

Naturally, for the sake of simplification, the first and second contact layers may be made of one and the same material.

The thickness of the first and/or of the second contact layer is preferably greater than or equal to 3 nm, or even greater than or equal to 5 nm and may also be less than or equal to 20 nm, or even 10 nm.

In case of repeated sequence(s) (electrode having three or more metallic layers) as already described, the or each metallic layer added may be on a contact layer made of one or more of the materials mentioned above for the contact layers.

The substrate according to the invention covered by the lower electrode preferably has a low roughness such that the difference between the lowest point and the highest point ("peak-to-valley" height) on the overlayer is less than or equal to 10 nm.

The substrate according to the invention covered by the lower electrode preferably has, on the overlayer, an RMS roughness less than or equal to 10 nm, even less than or equal to 5 or 3 nm, preferably even less than or equal to 2 nm, 1.5 nm or even less than or else equal to 1 nm, so as to avoid spike effects, which drastically reduce the lifetime and the reliability especially of the OLED.

The RMS roughness denotes the root mean square roughness. This is a measure of the RMS deviation of the roughness. This RMS roughness therefore specifically quantifies on average the height of the peaks and troughs of the roughness relative to the average height. Thus, an RMS roughness of 2 nm means an average double peak amplitude.

It may be measured in various ways: for example, by atomic force microscopy, by a mechanical stylus system (using for example the measurement instruments sold by VEECO under the name DEKTAK) and by optical interferometry. The measurement is generally performed over an area of one square micron by atomic force microscopy and over a larger area, of around 50 square microns to 2 square millimeters, by mechanical stylus systems.

This low roughness is in particular achieved when the substrate comprises a first smoothing layer, especially a non-crystalline smoothing layer, said first smoothing layer being positioned immediately beneath the first contact layer and being made of a material other than that of the contact layer.

The first smoothing layer is, preferably, a doped or undoped, single or mixed oxide layer based on an oxide of one or more of the following metals: Sn, Si, Ti, Zr, Hf, Zn, Ga and In, and in particular is an optionally doped mixed oxide layer based on zinc and tin or a mixed indium tin oxide (ITO) layer or a mixed indium zinc oxide (IZO) layer.

The first smoothing layer may in particular be based on a mixed oxide of zinc and tin $Sn_xZn_yO_z$, in particular that is non-stoichiometric and in an amorphous phase, and is optionally doped, in particular with antimony, or on a mixed indium tin oxide (ITO) in particular that is deposited at low temperature, or on a mixed indium zinc oxide (IZO).

This first smoothing layer may preferably be on the base layer or else directly on the substrate.

It is also possible to use a second smoothing layer directly beneath the second contact layer and made of the materials already listed for the first smoothing layer.

Naturally, for the sake of simplification, the first and second smoothing layers may be made of one and the same material.

More broadly, it is possible to use a doped or undoped $Sn_xZn_yO_z$ layer that is optionally non-stoichiometric in oxygen, directly beneath the first metallic layer (apart from the optional underblocker) and/or a doped or undoped $Sn_xZn_yO_z$ layer directly beneath the second metallic layer (apart from the optional underblocker).

The first separating layer may comprise, beneath the second contact layer and beneath the optional second smoothing layer, a first additional layer of optionally doped metal oxide such as zinc oxide (doped with aluminium for example), tin oxide, and/or a second additional layer based on silicon nitride.

Preferably the additional layer is made from the material of the second contact layer, in particular based on ZnO.

It was observed that an additional layer based on ZnO (with or without an overblocker as explained in detail later on), or even on ITO, was particularly compatible with the silver layer.

The thickness of the additional layer (just like the thickness of the first and/or of the second contact layer) is preferably greater than or equal to 3 nm or even greater than or equal to 5 nm and may also be less than or equal to 20 nm or even 10 nm.

To obtain a desired optical thickness L2, it is possible to limit the thicknesses of the optional additional layer and/or of the second contact layer as indicated and/or it is possible to choose a first separating layer for which at least half, or even 60%, 70%, 75% or more, of its geometric thickness is composed of the smoothing layer (optionally forming a contact layer), in particular of $Sn_xZn_yO_z$ alone, of $Si_xN_y$ alone or combined with superjacent $Sn_xZn_yO_z$ or $SnO_2$. For example, the following are provided (beneath an optional contact layer, in particular based on ZnO): $Si_3N_4/Sn_xZn_yO_z$, $Si_3N_4/SnO_2$, $Sn_xZn_yO_z$ alone.

To obtain a desired optical thickness L1, it is possible to limit the thicknesses of the first contact layer as indicated and/or it is possible to choose a sublayer for which at least half, or even 60%, 80% or more, of its geometric thickness is composed of the base layer and/or preferably of the first smoothing layer (optionally forming a base layer), in particular layers of $Si_xN_y$, $SnO_2$, $TiO_2$ alone or stacked, and/or of the smoothing layer $Sn_xZn_yO_z$ preferably directly on the substrate. For example, the following are provided: $Si_3N_4$/$Sn_xZn_yO_z$, $SnO_2$/$Sn_xZn_yO_z$, $SnO_2$/$TiO_2$, $TiO_2$/$Sn_xZn_yO_z$, $Sn_xZn_yO_z$ alone.

In case of added sequence(s) (electrode having three or more metallic layers) as already described, the or each separating layer added may comprise a smoothing layer and/or a contact layer made of the aforementioned materials with optional overblockers and/or underblockers.

The overlayer for adapting the work function may have a work function Ws starting from 4.5 eV and preferably greater than or equal to 5 eV.

The overlayer according to the invention is preferably based on a single or mixed oxide, based on at least one of the following, optionally doped, metal oxides: tin oxide, indium oxide, zinc oxide optionally sub-stoichiometric, aluminium oxide, chromium oxide, titanium oxide, molybdenum oxide, zirconium oxide, antimony oxide, tantalum oxide, silicon oxide or niobium oxide.

This overlayer may, in particular, be made of tin oxide optionally doped with F, Sb, or made of zinc oxide optionally doped with aluminium, or be optionally based on a mixed oxide, especially a mixed indium tin oxide (ITO), a mixed indium zinc oxide (IZO), or a mixed oxide of zinc and tin $Sn_xZn_yO_z$.

This overlayer may preferably have a thickness e3 less than or equal to 40 nm, in particular less than or equal to 30 nm, for example between 15 and 30 nm.

The overlayer according to the invention may be, alternatively, a thin metallic layer, especially one based on nickel, platinum or palladium, for example having a thickness less than or equal to 5 nm, in particular from 1 to 2 nm, and separated from the second metallic layer by a subjacent layer, called a spacer layer, made of a single or mixed metal oxide, such as those mentioned above for the overlayer or the smoothing or contact layers.

The lower electrode according to the invention is easy to manufacture, in particular by choosing, for the materials of the stack, materials that may be deposited at ambient temperature and that do not require thermal annealing to obtain correct electrical conductivity, such as ITO. More preferably still, most or even all of the layers of the stack are deposited under vacuum (preferably successively) preferably by sputtering, optionally magnetron sputtering, enabling significant productivity gains.

To further reduce the cost of the lower electrode, it may be preferred that the total thickness of material containing (preferably predominantly, that is to say with a weight percentage of indium greater than or equal to 50%) indium of this electrode be less than or equal to 60 nm, or even less than or equal to 50 nm, 40 nm, or even 30 nm. Mention may be made, for example, of ITO and IZO as layer(s) for which it is preferable to limit the thicknesses.

Preferably:
the anti-reflection sublayer is a bilayer (apart from the thin blocking layer), in particular composed of a smoothing layer and of a contact layer, made of metal oxides; and/or the first separating layer (apart from the thin blocking layer(s)) is a bilayer, made of metal oxides, with a smoothing layer and a contact layer, or is a trilayer, made of metal oxides, with an additional layer as a first layer.

It is also possible to provide one or even two very thin coating(s) called "blocking coatings" deposited directly beneath, on top of or on each side of the first and/or the second metallic layer, especially when these layers are based on silver.

The underblocking coating subjacent to a metallic layer (the first and/or the second), in the direction of the substrate, is a bonding, nucleating and/or protective coating.

The overblocking coating superjacent to a metallic layer (the first and/or the second) serves as a protective or "sacrificial" coating so as to prevent impairment of the metallic layer by attack and/or migration of oxygen from a layer that surmounts it, or also by migration of oxygen if the layer that surmounts it is deposited by sputtering in the presence of oxygen.

The metallic layer (the first and/or the second) may thus be positioned directly on at least one subjacent blocking coating and/or directly beneath at least one superjacent blocking coating, each coating having a thickness preferably between 0.5 and 5 nm.

Within the context of the present invention, when it is specified that a deposit of a layer or coating (comprising one or more layers) is formed directly beneath or directly on another deposit, there may be no interposition of any layer between these two deposits.

At least one blocking coating preferably comprises a metallic, metal nitride and/or metal oxide layer, based on at least one of the following metals: Ti, V, Mn, Fe, Co, Cu, Zn, Zr, Hf, Al, Nb, Ni, Cr, Mo, Ta, W, or based on an alloy of at least one of said materials, preferably based on Ni or Ti, based on an alloy of Ni, or based on an alloy of NiCr.

For example, a blocking coating may be composed of a layer based on niobium, tantalum, titanium, chromium or nickel or on an alloy formed from at least two of said metals, such as a nickel-chromium alloy.

A thin blocking layer forms a protective layer or even a "sacrificial" layer, which prevents impairment of the metal of the metallic layer (the first and/or the second) especially in one and/or the other of the following configurations:
if the layer that surmounts the metallic layer (the first and/or the second) is deposited using a reactive (oxygen, nitrogen, etc.) plasma, for example if the oxide layer that surmounts it is deposited by sputtering;
if the composition of the layer that surmounts the metallic layer (the first and/or the second), is liable to vary during industrial fabrication (variation in the deposition conditions, of the target wear type, etc.), especially if the stoichiometry of an oxide and/or nitride type layer varies, therefore modifying the quality of the metallic layer and therefore the properties (sheet resistance, light transmission, etc.) of the electrode; and
if the electrode coating undergoes a heat treatment after deposition.

This protective or sacrificial layer significantly improves the reproducibility of the electrical and optical properties of the electrode. This is very important for an industrial approach in which only a small scatter in the properties of the electrodes is acceptable.

A thin blocking layer based on a metal chosen from niobium Nb, tantalum Ta, titanium Ti, chromium Cr or nickel Ni, or based on an alloy formed from at least two of these metals, especially a niobium/tantalum (Nb/Ta) alloy, a niobium/chromium (Nb/Cr) alloy or a tantalum/chromium (Ta/Cr) alloy or a nickel/chromium (Ni/Cr) alloy, is particularly preferred. This type of layer based on at least one metal has a particularly strong gettering effect.

A thin metallic blocking layer may be easily fabricated without impairing the metallic layer (the first and/or the second). This metallic layer may preferably be deposited in an inert atmosphere (i.e. into which no oxygen or nitrogen has been intentionally introduced, consisting of a noble gas (He, Ne, Xe, Ar, Kr). It is neither excluded nor is it problematic for this metallic layer to be oxidized on the surface during subsequent deposition of a layer based on a metal oxide.

The thin metallic blocking layer also provides excellent mechanical behaviour (especially abrasion and scratch resistance).

However, for the use of a metallic blocking layer it is necessary to limit the thickness of the metallic layer and therefore the light absorption in order to retain sufficient light transmission for the transparent electrodes.

The thin blocking layer may be partially oxidized. This layer is deposited in non-metallic form and is therefore not deposited in stoichiometric form but in substoichiometric form, of the $MO_x$ type, where M represents the material and x is a number lower than that for stoichiometry of the oxide of the material, or of the $MNO_x$ type for an oxide of two materials M and N (or of more than two). For example, mention may be made of $TiO_x$ and $NiCrO_x$.

Preferably, x is between 0.75 times and 0.99 times the number for normal stoichiometry of the oxide. For a monoxide, x may in particular be chosen to be between 0.5 and 0.98 and for a dioxide x may be between 1.5 and 1.98.

In one particular variant, the thin blocking layer is based on $TiO_x$ in which x may in particular be such that $1.5 \leq x \leq 1.98$ or $1.5 < x < 1.7$, or even $1.7 \leq x \leq 1.95$.

The thin blocking layer may be partially nitrided. It is therefore not deposited in stoichiometric form but in substoichiometric form of the type $MN_y$, where M represents the material and y is a number smaller than that for stoichiometry of the nitride of the material, y is preferably between 0.75 times and 0.99 times the number for normal stoichiometry of the nitride.

Likewise, the thin blocking layer may also be partially oxynitrided.

This thin oxidized and/or nitrided blocking layer may be readily fabricated without impairing the functional layer. It is preferably deposited using a ceramic target in a non-oxidizing atmosphere consisting preferably of a noble gas (He, Ne, Xe, Ar, Kr).

The thin blocking layer may preferably be made of a substoichiometric nitride and/or oxide in order to further increase the reproducibility of the electrical and optical properties of the electrode.

The chosen thin substoichiometric oxide and/or nitride blocking layer may preferably be based on a metal chosen from at least one of the following metals: Ti, V, Mn, Fe, Co, Cu, Zn, Zr, Hf, Al, Nb, Ni, Cr, Mo, Ta, W, or on an oxide of a substoichiometric alloy based on at least one of these materials.

Particularly preferred is a layer based on an oxide or oxynitride of a metal chosen from niobium Nb, tantalum Ta, titanium Ti, chromium Cr or nickel Ni or on an alloy formed from at least two of these metals, especially a niobium/tantalum (Nb/Ta) alloy, a niobium/chromium (Nb/Cr) alloy, a tantalum/chromium (Ta/Cr) alloy or a nickel/chromium (Ni/Cr) alloy.

As substoichiometric metal nitride, it is also possible to choose a layer made of silicon nitride $SiN_x$ or aluminium nitride $AlN_x$ or chromium nitride $CrN_x$ or titanium nitride $TiN_x$ or a nitride of several metals, such as $NiCrN_x$.

The thin blocking layer may have an oxidation gradient, for example $M(N)O_{x_i}$, with variable $x_i$, the part of the blocking layer in contact with the metallic layer being less oxidized than the part of this layer furthest away from the metallic layer, using a particular deposition atmosphere.

The blocking coating may also be a multilayer and in particular comprise:
- on the one hand, an "interfacial" layer immediately in contact with said functional layer, this interfacial layer being made of a material based on a non-stoichiometric metal oxide, nitride or oxynitride, such as those mentioned above;
- on the other hand, at least one layer made of a metallic material, such as those mentioned above, this layer being immediately in contact with said "interfacial" layer.

The interfacial layer may be an oxide, nitride or oxynitride of a metal or metals that is or are present in the optional adjacent metallic layer.

Naturally, for the sake of simplification, the first and second overblocking layers may be made of the same material and/or the first and second underblocking layers may be made of the same material.

The substrate furthermore preferably comprises a lower bus electrode structure on top of the lower electrode coating, said bus electrode structure being in electrical contact with said electrode coating.

The lower bus electrode structure is in the form of a layer for the supply of current before etching; it preferably has a thickness between 0.5 and 10 μm and preferably is in the form of a monolayer made from one of the following metals: Mo, Al, Cr, Nd or made of an alloy such as MoCr, AlNd or in the form of a multilayer such as MoCr/Al/MoCr.

All the layers of the electrode are preferably deposited by a vacuum deposition technique, but it is not, however, ruled out that the first layer or layers of the stack may be deposited via another technique, for example by a thermal decomposition technique of pyrolysis type.

All the electrode layers, may preferably be etched according to one and the same etching pattern, and preferably by a single etching, except the base layer which is not itself etched. The etch-stop layer, if it is present, is preferably also intact, but may be lightly etched, for example over a tenth of its initial thickness. The same is true of the base layer if the etch-stop layer is not present.

The substrate may be flat or curved, and also rigid, flexible or semi-flexible.

Its main faces may be rectangular, square or even of any other shape (round, oval, polygonal, etc.). This substrate may be of large size, for example having a surface area greater than 0.02 m² or even 0.5 m² or 1 m² and with a lower electrode (optionally divided into several zones known as electrode surfaces) occupying substantially the entire area (apart from the structuring zones and/or apart from the edge zones)

The substrate is substantially transparent. It may have a light transmission $T_L$ greater than or equal to 70%, preferably greater than or equal to 80% or even 90%.

The substrate may be mineral or made of a plastic such as polycarbonate PC or polymethyl methacrylate PMMA or else a polyethylene naphthalate PEN, a polyester, a polyimide, a polyestersulphone PES, a PET, a polytetrafluorethylene PTFE, a sheet of thermoplastic, for example polyvinyl butyral PVB, polyurethane PU, or made of ethylene/vinyl acetate EVA, or made of a thermally curable single-component or multi-component resin (epoxy, PU) or ultraviolet-curable single-component or multi-component resin (epoxy, acrylic resin), etc.

The substrate may preferably be made of glass, mineral glass, silicate glass, especially soda-lime or soda-lime-silica glass, a clear or extra-clear glass, a float glass. It may be a high index glass (especially having an index above 1.6). The substrate may advantageously be a glass having an absorption coefficient of less than 2.5 m$^{-1}$, preferably less than 0.7 m$^{-1}$ at the wavelength of the OLED radiations.

For example, soda-lime-silica glasses with less than 0.05% Fe III or $Fe_2O_3$, are chosen, especially the glass DIAMANT from Saint-Gobain Glass, the glass OPTIWHITE from Pilkington, or the glass B270 from Schott. All the extra-clear glass compositions described in document WO 04/025334 may be chosen.

With an emission of the OLED system through the thickness of the transparent substrate, one portion of the radiation emitted is guided in the substrate. Thus, in one advantageous design of the invention, the thickness of the chosen glass substrate may be at least 1 mm, for example preferably at least 5 mm. This allows the number of internal reflections to be reduced and thus enables more of the radiation guided in the glass to be extracted, thereby increasing the brightness of the luminous zone.

In one supplementary configuration, the substrate according to the invention comprises on a second main face, a functional coating chosen from: an anti-reflection multilayer, an anti-fogging or anti-fouling layer, an ultraviolet filter, especially a layer of titanium oxide, a phosphor layer, a mirror layer or a scattering light extraction zone.

Moreover, it is in general preferable to provide the electrode coating with a bus electrode before the deposition of the OLED system. The layer that will form the bus electrodes is, preferably, etched at the same time as the electrode coating.

It is possible to use the substrate as defined previously for an OLED device comprising at least one (solid) electrode zone with a size greater than or equal to 1×1 cm$^2$, or 5×5 cm$^2$, even 10×10 cm$^2$ and above.

It is possible to use the substrate as defined previously for an OLED device that forms a(n) (substantially white and/or uniform) illumination or backlighting panel, in particular having a (solid) electrode surface area with a size greater than or equal to 1×1 cm$^2$, or up to 5×5 cm$^2$, even 10×10 cm$^2$ and above.

Thus, the OLED may be designed to form a single illuminating paving stone (with a single electrode surface area) that illuminates with (substantially white) polychromatic light or a multitude of illuminating paving stones (with several electrode surface areas) that illuminate with (substantially white) polychromatic light, each illuminating paving stone equipped with a (solid) electrode surface area greater than or equal to 1×1 cm$^2$, or 5×5 cm$^2$, 10×10 cm$^2$ and above.

Thus, in an OLED device according to the invention, in particular for illumination, an unpixellated electrode may be chosen. It is distinguished from a ("LCD", etc.) display electrode formed from 3 juxtaposed pixels, generally of very small dimensions, and that each emit a given, quasi-monochromatic (typically red, green or blue) radiation.

In order to produce an OLED device, the substrate according to the invention also comprises an OLED system, on top of the lower electrode as defined previously, provided for emitting a polychromatic radiation defined at 0° by the coordinates (x1, y1) in the CIE XYZ 1931 chromaticity diagram, coordinates given therefore for a radiation to the normal.

The OLED device may be bottom-emitting and optionally also top-emitting according to whether the upper electrode is reflective or semi-reflective, or even transparent (in particular having a $T_L$ comparable to the anode typically starting from 60% and preferably greater than or equal to 80%).

The OLED device may also comprise:
an upper electrode on top of said OLED system;
and preferably an upper bus electrode structure on top of the upper electrode coating, said bus electrode structure being in electrical contact with said upper electrode coating.

More preferably, an OLED device is produced that emits as the output a spectrum defined at 0° by its colorimetric coordinates (x2, y2) in the CIE XYZ 1931 chromaticity diagram, such that $\sqrt{((x1-x2)^2+(y1-y2)^2)}$ is less than 0.1, more preferably still less than or equal to 0.08, or even less than or equal to 0.03.

The OLED system may be adapted for emitting a (substantially) white light, the closest possible to the coordinates (0.33; 0.33) or to the coordinates (0.45; 0.41), especially at 0°.

To produce substantially white light, several methods are possible: mixing of compounds (red, green, blue emission) in a single layer; stacking on the face of the electrodes of three organic structures (red, green and blue emission) or two organic structures (yellow and blue).

The OLED device may be adapted for producing as the output (substantially) white light, the closest possible to the coordinates (0.33; 0.33) or to the coordinates (0.45; 0.41), especially at 0°.

Also, to evaluate the colour difference at 0°, it is possible, for example, to take for (x1; y1) the coordinates (0.33; 0.33), or the coordinates (0.45; 0.41).

Moreover, to assess the angular dependence of the colour once the OLED device is produced, the colour difference is evaluated as a function of the angle $V_{colour}$, that is to say the path length, in the CIE XYZ 1931 chromaticity diagram, between the spectrum emitted at 0° and the spectrum emitted at 60°, by passing through at least one intermediate angle such as, for example, 30°.

This path may have various shapes such as a straight line or an arc, for example. Measurement of the colour variation is carried out by measuring the spectrum of the light-emitting device at different angles (for example between 0° and a given critical angle $\theta_c$ equal to 60°, every 5°) with a spectrophotometer. Then, the colorimetric coordinates for each spectrum of angle $\theta_i$ are expressed by the pair $(x(\theta_i); y(\theta_i))$ in the CIE XYZ 1931 chromaticity diagram.

The $V_{colour}$ path length may be calculated using the following equation:

$$V_{colour} = \sum_{\theta_i=0}^{\theta_i=\theta_c} \sqrt{(x(\theta_i) - x(\theta_{i+1}))^2 + (y(\theta_i) - y(\theta_{i+1}))^2}$$

The $V_{colour}$ path length is minimized and may thus be less than or equal to 0.1, more preferably still less than or equal to 0.08, or less than or equal to 0.05, even 0.03. It may be further optimized by minimizing the path length between 0° and 85°.

The device may form part of a multiple glazing unit, especially a vacuum glazing unit or one with an air layer or layer of another gas. The device may also be monolithic and comprise a monolithic glazing unit in order to be more compact and/or lighter.

The OLED system may be bonded to, or preferably laminated with another flat substrate, called a cover, preferably transparent, such as a glass, using a lamination interlayer, especially an extra-clear interlayer.

The laminated glazing units usually consist of two rigid substrates between which a thermoplastic polymer sheet or superposition of such sheets is placed. The invention also includes what are called "asymmetric" laminated glazing units using a substrate in particular a rigid carrier substrate of the glass type and, as a covering substrate, one or more protective polymer sheets.

The invention also includes laminated glazing units having at least one interlayer sheet based on a single-sided or double-sided adhesive polymer of the elastomer type (i.e. one not requiring a lamination operation in the conventional meaning of the term, i.e. lamination requiring heating generally under pressure so as to soften the thermoplastic interlayer sheet and make it adhere).

In this configuration, the means for fastening the cover to the carrier substrate may then be a lamination interlayer, especially a sheet of thermoplastic, for example polyurethane (PU), polyvinyl butyral (PVB) or ethylene/vinyl acetate (EVA), or a thermally curable single-component or multi-component resin (epoxy, PU) or ultraviolet-curable single-component or multi-component resin (epoxy, acrylic resin). Preferably, a sheet has (substantially) the same dimensions as the cover and the substrate.

The lamination interlayer may prevent the cover from flexing, especially for large devices, for example with an area greater than $0.5 \text{ m}^2$.

In particular, EVA offers many advantages:
it contains little or no water by volume;
it does not necessarily require high pressure for processing it.

A thermoplastic lamination interlayer may be preferred to a cover made of cast resin as it is both easier to implement and less expensive and is possibly more impervious.

The interlayer optionally includes an array of electroconductive wires set into its internal surface, facing the upper electrode, and/or an electroconductive layer or electroconductive bands on the internal surface of the cover.

The OLED system may preferably be placed inside the double glazing unit, especially with an inert gas (for example argon) layer.

The upper electrode may be an electroconductive layer advantageously chosen from metal oxides, in particular the following materials:
doped zinc oxide, especially aluminium-doped zinc oxide ZnO:Al or gallium-doped zinc oxide ZnO:Ga;
or else doped indium oxide, especially tin-doped indium oxide (ITO) or zinc-doped indium oxide (IZO).

More generally, it is possible to use any type of transparent electroconductive layer, for example a TCO (transparent conductive oxide) layer, for example with a thickness between 20 and 1000 nm, typically 120 nm for ITO.

It is also possible to use a thin metallic layer known as a "TCC" (transparent conductive coating) for example made of Ag, Al, Pd, Cu, Pd, Pt In, Mo or Au and typically having a thickness between 5 and 150 nm depending on the desired light transmission/reflection. For example, a layer of silver is transparent below 15 nm and opaque from 40 nm.

The electrode is not necessarily continuous. The upper electrode may comprise a plurality of conductive bands or conductive wires (grid).

Furthermore, it may be advantageous to add a coating having a given functionality on the opposite face from the substrate bearing the electrode according to the invention or on an additional substrate. This may be an anti-fogging layer (using a hydrophilic layer), an anti-fouling layer (a photocatalytic coating comprising $TiO_2$, at least partly crystallized in anatase form), or else an anti-reflection stack for example of the $Si_3N_4/SiO_2/Si_3N_4/SiO_2$ type, or else a UV filter such as, for example, a layer of titanium oxide ($TiO_2$). It may also be one or more phosphor layers, a mirror layer or at least one scattering light extraction zone.

The invention also relates to the various applications to which these OLED devices may be put, said devices forming one or more luminous surfaces, which are transparent and/or reflecting (mirror function), used both for outdoor and indoor applications.

The device may form, alternatively or in combination, an illuminating, decorative, architectural etc. system, or an indicating display panel—for example of the drawing, logo or alpha-numeric indication type, especially an emergency exit panel.

The OLED device may be arranged to produce uniform polychromatic light, especially for homogeneous illumination, or to produce various luminous zones, of the same intensity or of different intensity.

Conversely, differentiated polychromatic illumination may be sought. The organic light-emitting system (OLED) produces a direct light zone, and another luminous zone is obtained by extraction of the OLED radiation that is guided by total reflection in the thickness of the substrate, which is chosen to be made of glass.

To form this other luminous zone, the extraction zone may be adjacent to the OLED system or on the other side from the substrate. The extraction zone or zones may serve for example to increase the illumination provided by the direct light zone, especially for architectural illumination, or else for indicating the luminous panel. The extraction zone or zones are preferably in the form of one or more, especially uniform, bands of light and these preferably being placed on the periphery of one of the faces. These bands may for example form a highly luminous frame.

Extraction is achieved by at least one of the following means placed in the extraction zone: a light-diffusing layer, the substrate made to be light-diffusing, especially a textured or rough substrate.

When the electrodes and the organic structure of the OLED system are chosen to be transparent, an illuminating window may in particular be produced. Improvement in illumination of the room is then not to the detriment of light transmission. By also limiting the light reflection, especially on the external side of the illuminating window, it is also possible to control the level of reflection, for example so as to meet the anti-dazzling standards in force for the walls of buildings.

More broadly, the device, especially a partly or entirely transparent device, may be:
intended for buildings, such as exterior luminous glazing, an internal luminous partition or a luminous glazed door (or part of a door), especially a sliding one;
intended for a transport vehicle, such as a luminous roof, a luminous side window (or part of a window), an internal luminous partition of a terrestrial, water-borne or airborne vehicle (car, lorry, train, aeroplane, boat, etc.);
intended for urban or professional furniture, such as a bus shelter panel, a wall of a display counter, a jewellery display or a shop window, a greenhouse wall, or an illuminating tile;
intended for interior furnishings, a shelf or cabinet element, a façade of a cabinet, an illuminating tile, a ceiling, an illuminating refrigerator shelf, an aquarium wall;
intended for the backlighting of electronic equipment, especially a display screen, optionally a double screen, such as a television or computer screen, a touch screen.

To form an illuminating mirror, the upper electrode may be reflective.

It may also be a mirror. The luminous panel may serve for illuminating a bathroom wall or a kitchen worktop, or may be a ceiling.

The OLEDs are generally divided into two broad families depending on the organic material used.

If the electroluminescent layers are small molecules, the devices are referred to as SM-OLEDs (Small-Molecule Organic Light-Emitting Diodes).

In general, the structure of an SM-OLED consists of a stack of an HIL (hole injection layer) and an HTL (hole transporting layer), an emissive layer and an ETL (electron transporting layer).

Examples of organic light-emitting stacks are for example described in the document entitled "Four-wavelength white organic light-emitting diodes using 4,4'-bis-[carbazoyl-(9)]-stilbene as a deep blue emissive layer", by C. H. Jeong et al., published in Organic Electronics 8 (2007) pages 683-689.

If the organic electroluminescent layers are polymers, the devices are referred to as PLEDs (polymer light-emitting diodes).

The organic OLED layer(s) generally have an index starting from 1.8 or above (1.9 or even more).

Preferably, the OLED device may comprise an OLED system that is more or less thick, for example between 50 and 350 nm or 300 nm, in particular between 90 and 130 nm, or even between 100 and 120 nm.

The position of the emitters of each family in the cavities may influence the fine adjustment of L2 and/or of L1.

The invention will now be described in greater detail by means of non-limiting examples and figures.

For the sake of clarity, it should be mentioned that the various elements of the objects (including the angles) shown are not necessarily drawn to scale.

Figure 1:
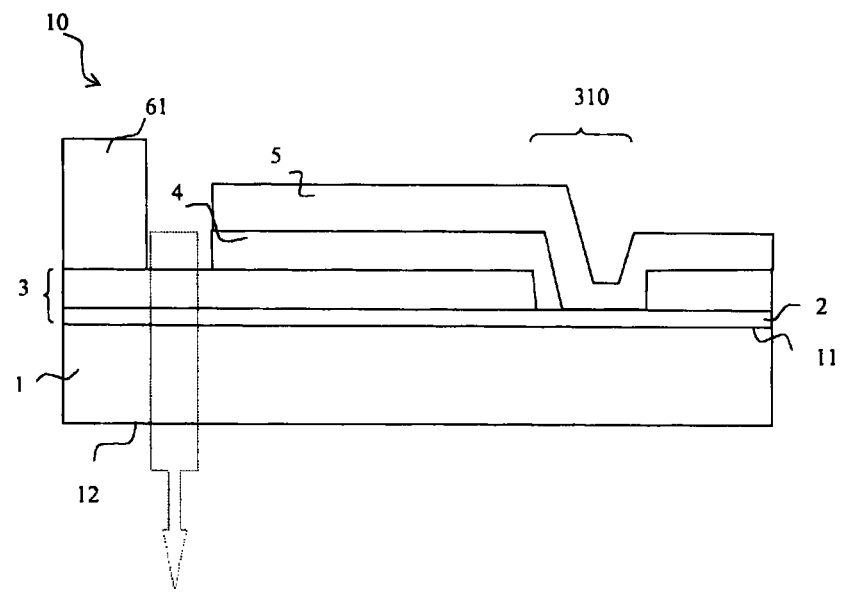
FIG. 1 is a schematic sectional view of an organic light-emitting device for uniform illumination, which includes a lower electrode according to the invention in a first embodiment.
Figure 2:
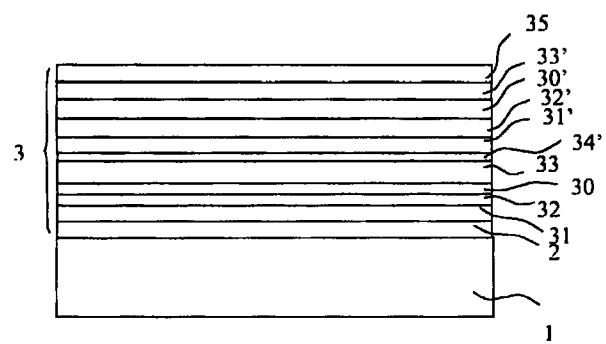
FIG. 2 is a partial view showing this lower electrode in greater detail.

FIG. 1 is intentionally highly schematic. It shows in cross section an organic light-emitting device 10 (with emission through the substrate or "bottom emission") successively comprising:
- a flat substrate 1 of optionally clear or extra-clear soda-lime-silica glass for example having a thickness starting from 0.7 mm, with first and second main faces 11, 12, the first main face 11 firstly comprising a (semi-)transparent lower electrode 3, comprising the following stack of layers (see FIG. 2):
- an anti-reflection sublayer comprising:
    - a base layer 2, deposited directly on the first main face 11, made of silicon nitride and covering substantially the whole of the first main face 11;
    - a first smoothing layer 31 made of $Sn_yZn_zO_x$ doped with antimony Sb, which as a variant is deposited directly on the face 11;
    - a first contact layer 32 made of aluminium-doped $ZnO_x$;
- a first metallic layer 30, preferably made of silver, for example pure silver;
- a first separating layer comprising:
    - optionally a superjacent overblocking coating 33, directly on the metallic layer 32;
    - optionally an additional layer 34 made of aluminium-doped $ZnO_x$;
    - a second smoothing layer 31' made of $Sn_yZn_zO_x$ doped with antimony Sb;
    - a second contact layer 32' made of aluminium-doped $ZnO_x$;
- a second metallic layer 30', preferably made of silver, for example pure silver;
- optionally an overblocking coating 33';
- an overlayer 35 for adapting the work function, made of ITO.

The device 10 also comprises on the electrode 3:
an organic light-emitting system 4, for example an SM-OLED emitting a white light, formed from:
- 45 nm of 2-TNATA;
- 15 nm of NPB (10 nm);
- 5 nm of NPB:DCJTB (0.2 wt %);
- 6 nm of BCS:perylene (0.5 wt %);
- 1 nm of $Alq_3$:C545T (0.2 wt %);
- 50 nm of $Alq_3$; and
- 1 nm of Li.

These layers are described in the document entitled "Four-wavelength white organic light-emitting diodes using 4,4'-bis-[carbazoyl-(9)]-stilbene as a deep blue emissive layer", by C. H. Jeong et al., published in Organic Electronics 8 (2007) pages 683-689.

The device 10 also comprises on the OLED system 4:
an upper (semi-)reflective metallic electrode 5, in particular based on silver or on aluminium.

A series of examples 1 to 5 of depositing stacks for producing the lower electrode according to the invention was carried out by magnetron sputtering, at ambient temperature, in general the substrate 1.

By way of comparison, the following are also presented:
an established example No. 6 of an electrode based on a single layer of silver between an anti-reflection sublayer and an overlayer; and
a conventional example No. 7 of an electrode based on ITO.

Table 1 below summarizes the nature and the geometric thickness in nanometers of the various layers of these examples, and also their main optical and electrical characteristics.

TABLE 1

| | Examples | | | | | | |
|---|---|---|---|---|---|---|---|
| | No. 1 | No. 2 | No. 3 | No. 4 | No. 5 | No. 6 comparative | No. 7 comparative |
| Layers/e (nm) | | | | | | | |
| ITO | | | | | | | 120 |
| $Si_3N_4$ | 30 | 23 | 26 | 15 | | 21 | |
| SnZnO | 5 | 7 | 4 | 6 | 45 | 5 | |
| ZnO | 5 | 3 | 6 | 4 | 5 | 5 | |
| Ag | 8 | 9 | 11 | 9 | 8 | 12 | |
| Ti | 0.5 | <1 | <1 | <1 | <1 | 0.5 | |
| ZnO | 5 | 5 | 5 | 5 | 5 | | |
| SnZnO | 60 | 46 | 49 | 39 | 75 | | |
| ZnO | 5 | 5 | 5 | 5 | 5 | | |
| Ag | 8 | 8 | 8 | 8 | 8 | | |
| Ti | 0.5 | <1 | <1 | <1 | <1 | | |
| ITO | 20 | 22 | 18 | 32 | 50 | 10 | |

TABLE 1-continued

| | Examples | | | | | | |
|---|---|---|---|---|---|---|---|
| | No. 1 | No. 2 | No. 3 | No. 4 | No. 5 | No. 6 comparative | No. 7 comparative |
| Properties of the stack | | | | | | | |
| L1 (nm) | 80 | 65 | 70 | 50 | 100 | | |
| L2 (nm) | 140 | 110 | 115 | 100 | 170 | | |
| $T_L$ (%) | 80 | 80 | 77 | 75 | | 65 | 85 |
| Sheet resistance ($\Omega/\square$) | 2.7 | 2.6 | 2.4 | 2.6 | | 3.5 | 15 |

The deposition conditions for each of the layers were the following:
- the $Si_3N_4$:Al-based layers were deposited by reactive sputtering using an aluminium-doped silicon target, under a pressure of 0.25 Pa in a argon/nitrogen atmosphere;
- the SnZn:$SbO_x$-based layers were deposited by reactive sputtering using an antimony-doped zinc and tin target comprising 65 wt % Sn, 34 wt % Zn and 1 wt % Sb, under a pressure of 0.2 Pa and in an argon/oxygen atmosphere;
- the silver-based layers were deposited using a silver target, under a pressure of 0.8 Pa in a pure argon atmosphere;
- the Ti layers were deposited using a titanium target, under a pressure of 0.8 Pa in a pure argon atmosphere;
- the ZnO:Al-based layers were deposited by reactive sputtering using an aluminium-doped zinc target, under a pressure of 0.2 Pa and in an argon/oxygen atmosphere; and
- the ITO-based overlayers were deposited using a ceramic target in an argon/oxygen atmosphere, under a pressure of 0.2 Pa and in an argon/oxygen atmosphere.

The lower electrode may, as a variant, comprise a subjacent blocking coating, comprising in particular, as the superjacent blocking coating, a metallic layer preferably obtained by a metallic target with a neutral plasma or a layer made of a nitride and/or oxide of one or more metals such as Ti, Ni, Cr, preferably obtained by a ceramic target with a neutral plasma.

The lower electrode 3 sticks out over one side of the substrate 1. The edge of the overlayer 35 is thus surmounted by a first metal current lead band 61, preferably having a thickness between 0.5 and 10 µm, for example 5 µm, and in the form of a layer made of one of the following metals: Mo, Al, Cr, Nd or made of an alloy such as MoCr, AlNd or made of a multilayer such as MoCr/Al/MoCr.

The upper electrode sticks out over the opposite side of the substrate 1. This edge of the upper electrode 5 is optionally surmounted by a second metal current lead band, preferably similar to the first metal band. This second band is preferred in the case where the upper electrode has a thickness less than or equal to 50 nm.

Specifically, the upper electrode may also be, as a variant, a transparent or semi-transparent electrode, for example a layer of aluminium. It may also, for example, be identical or similar to the lower electrode. In this case a reflector is optionally added to the second face 12, for example a metallic layer with a thickness of 150 nm.

An EVA-type sheet may make it possible to laminate the substrate 1 to another glass, preferably having the same characteristics as the substrate 1. Optionally, the face 12 of the glass 1 turned towards the EVA sheet is provided with a stack of given functionality described later on.

The lower electrode 3 is made of two parts spaced apart by the etching zone 310.

Wet etching is used for electrically separating the lower electrode 3 from the upper electrode 5 of the device 10.

Table 2 below summarizes the optical properties of the OLED device of the aforementioned examples 1 to 4 and of the comparative examples 6 and 7, in particular by taking the illuminant E as a reference.

TABLE 2

| | Examples | | | | | |
|---|---|---|---|---|---|---|
| | No. 1 | No. 2 | No. 3 | No. 4 | No. 6 comparative | No. 7 comparative |
| Colorimetric coordinates at 0° (x2; y2) | (0.38; 0.4) | (0.36; 0.35) | (0.34; 0.35) | (0.33; 0.33) | (0.40; 0.42) | (0.36; 0.35) |
| Colour difference at 0° with respect to the white emitter (0.33; 0.33) | 0.081 | 0.031 | 0.018 | 0.005 | 0.109 | 0.031 |
| Angular dependence $V_{colour}$ | 0.08 | 0.03 | 0.030 | 0.02 | 0.13 | 0.07 |
| Extraction efficiency* | 24% | 23% | 24% | 21% | 26% | 21% |

To calculate the extraction efficiency, firstly the external quantum efficiency $P_{out}/P_{in}$ is calculated, that is to say the ratio between the electrical power $P_{out}$ injected into the OLED device and the luminous power $P_{in}$ integrated between 0 and 85°. Next, by considering an internal quantum efficiency of 25%, the external quantum efficiency is divided by 0.25 to obtain the extraction efficiency.

Table 3 below summarizes the optical properties of the OLED device of the aforementioned example 5, in particular by taking the illuminant A as a reference.

TABLE 3

| Example | No. 5 |
|---|---|
| Colorimetric coordinates at 0° (x2; y2) | (0.43; 0.48) |
| Colour difference at 0° with respect to the "yellow" emitter (0.45; 0.41) | 0.07 |
| Angular dependence $V_{colour}$ | 0.04 |

The values from Tables 2 and 3 show that the silver bilayer electrode (Examples 1 to 5) makes it possible to obtain a very low angular colorimetric dependence and does not adversely affect the extraction efficiency.

Figure 3:
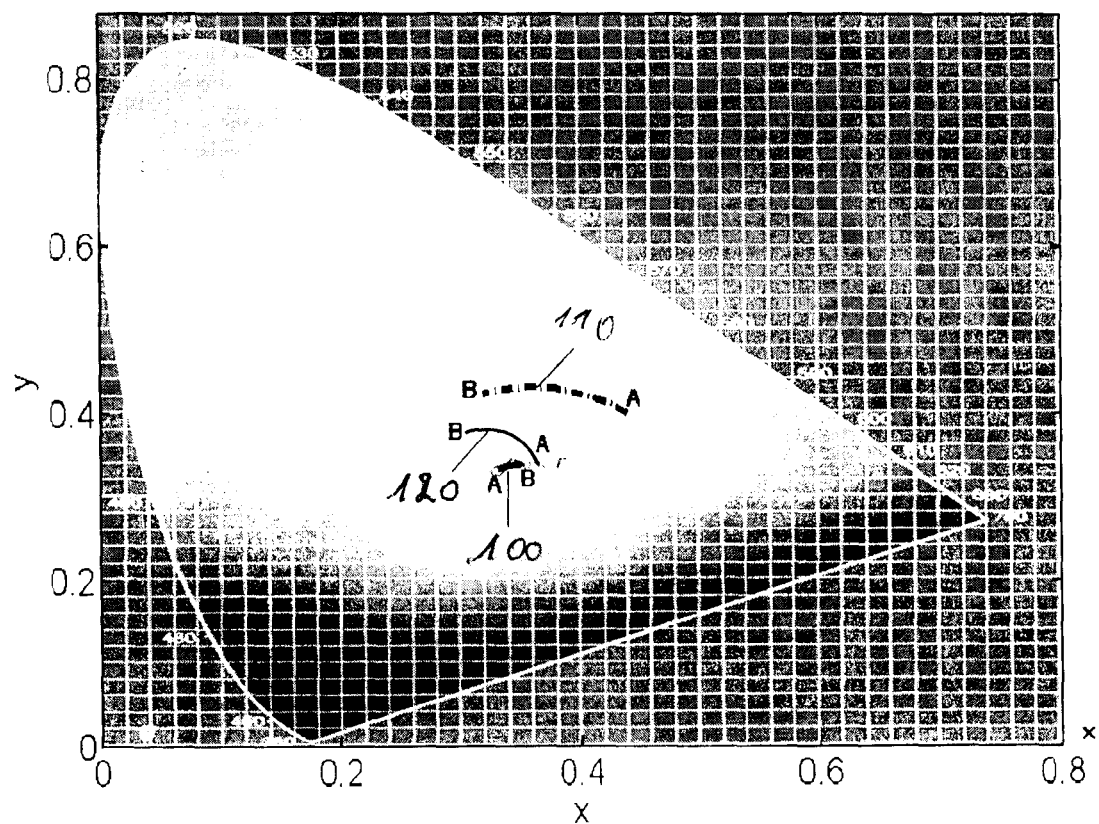
FIG. 3 is a view showing, in the chromaticity diagram, various path lengths.

FIG. 3 shows the change in the colorimetric coordinates in the CIE XYZ 1931 chromaticity diagram as a function of the angle of observation in air for Examples 2 (curve 100), 6 (curve 110), and 7 (curve 120).

It can thus be seen that the path that is shortest and closest to the white emitter (0.33; 0.33) corresponds to the silver bilayer electrode.

Figure 4:
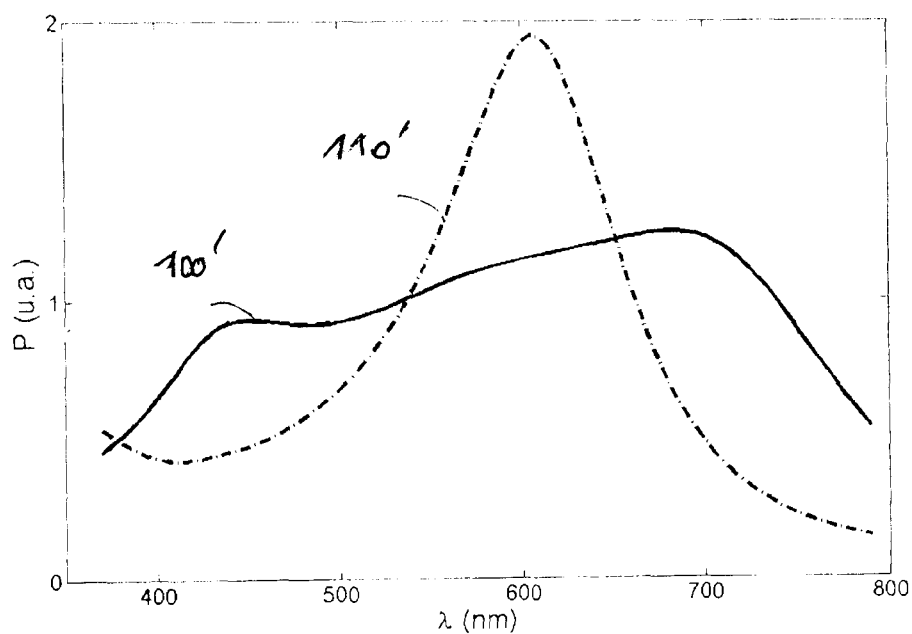
FIG. 4 shows spectra of OLED devices.

FIG. 4 shows the spectra of the OLED devices for Examples 2 (curve 100') and 6 (curve 110') at 0°.

It can thus be seen that the spectrum 100' obtained by virtue of the bilayer electrode is relatively flat over a large part of the visible spectrum unlike the spectrum 110'.

It goes without saying that the invention applies in the same manner when using light-emitting systems other than those described in the examples.

The present invention is described in the foregoing by way of example. It is understood that a person skilled in the art is able to produce various variants of the invention without however departing from the scope of the patent as defined by the claims.

The invention claimed is:

1. A substrate for an organic light-emitting device, comprising a transparent substrate having an optical index n0, bearing, on a first main face, a first transparent or semi-transparent coating of an electrode and which comprises:
   an anti-reflection sublayer having a first optical thickness and having an optical index n1 such that the ratio of n1 to n0 is greater than or equal to 6/5;
   a first metallic layer having a second thickness, positioned on the anti-reflection sublayer;
   an overlayer for adapting a work function of the first transparent or semi-transparent coating of the electrode and comprising a metal oxide selected from the group consisting of a mixed indium tin oxide, a mixed indium zinc oxide, a mixed oxide of zinc and tin, and a mixture thereof, having a third thickness, positioned on the first metallic layer, wherein the overlayer is the last layer of the electrode so as to be provided between an OLED system of the organic light-emitting device and the substrate;
   a first separating layer, having a fourth optical thickness, positioned on the first metallic layer and beneath the overlayer;
   a second metallic layer, having an intrinsic electrical conductivity property, and having a fifth thickness, said second layer being positioned between the first separating layer and the overlayer;
   wherein the first optical thickness is between 20 nm and 120 nm, the fourth optical thickness is between 75 nm and 200 nm, and the sum of the second and fifth thicknesses of the first and second metallic layers is less than or equal to 40 nm;
   and wherein the electrode has a sheet resistance less than or equal to 6Ω/□.

2. The substrate according to claim 1, wherein the first optical thickness is less than or equal to 100 nm and/or the fourth optical thickness is less than or equal to 160 nm.

3. The substrate according to claim 1, wherein the first optical thickness is less than the fourth optical thickness.

4. The substrate according to claim 1, wherein the first and second metallic layers are based on silver, wherein the second thickness of the first metallic layer is less than or equal to 15 nm and/or the fifth thickness of the second metallic layer is less than or equal to 15 nm, and the second thickness is greater than the fifth thickness.

5. The substrate according to claim 1, wherein the electrode has a sheet resistance less than or equal to 3Ω/□.

6. The substrate according to claim 1, wherein the anti-reflection sublayer comprises a base layer having a thickness greater than or equal to 3 nm that forms a barrier to alkali metals and/or an etch-stop layer, the base layer substantially covering said main face of the substrate and being made of an optionally doped material based on silicon nitride, silicon oxycarbide, silicon oxynitride or silicon oxycarbonitride.

7. The substrate according to claim 1, wherein the anti-reflection sublayer comprises a first contact layer based on a metal oxide and/or metal nitride, subjacent to the first metallic layer and/or the first separating layer comprises a second contact layer based on a metal oxide and/or metal nitride, subjacent to the second metallic layer.

8. The substrate according to claim 7, wherein the first and/or the second contact layer is based on at least one of the following metal oxides, optionally doped: chromium oxide, indium oxide, zinc oxide optionally sub-stoichiometric, aluminium oxide, titanium oxide, molybdenum oxide, zirconium oxide, antimony oxide, tin oxide, tantalum oxide or silicon oxide and wherein the first and/or the second contact layer has a thickness greater than or equal to 3 nm.

9. The substrate according to claim 7, wherein the first and/or the second contact layer is based on doped or undoped zinc oxide.

10. The substrate according to claim 7, wherein the anti-reflection sublayer comprises a first non-crystalline smoothing layer made of a single or mixed oxide, said smoothing layer being positioned immediately beneath said first contact layer, and being made of a material other than that of the first contact layer, and directly onto the substrate.

11. The substrate according to claim 10, wherein the first separating layer comprises a second non-crystalline smoothing layer made of a single or mixed oxide, said second smoothing layer being positioned immediately beneath said second contact layer and being made of a material other than that of the second contact layer.

12. The substrate according to claim 11, wherein the first and/or the second smoothing layer is a layer based on a single or mixed oxide, based on one or more of the following metals: Sn, Si, Ti, Zr, Hf, Zn, Ga, In.

13. The substrate according to claim 11, wherein at least 60% of the geometric thickness of the sublayer is made up of the first smoothing layer and/or at least 60% of the geometric thickness of the first separating layer is made up of the second smoothing layer.

14. The substrate according to claim 11, wherein the first smoothing layer is a layer based on an oxide that is non-stoichiometric in oxygen and is based on zinc and tin $Sn_xZn_yO_z$ and optionally doped and the first contact layer is a layer based on a doped or undoped oxide that is non-stoichiometric in oxygen and is based on zinc ZnO, and/or the second smoothing layer is a layer based on an oxide that is non-stoichiometric in oxygen and is based on zinc and tin $Sn_xZn_yO_z$ and optionally doped, and the second contact layer is a layer based on a doped or undoped oxide that is non-stoichiometric in oxygen and is based on zinc ZnO.

15. The substrate according to claim 11, wherein the first separating layer comprises, beneath the second contact layer and beneath the second smoothing layer, an additional layer of metal oxide and/or an additional layer based on silicon nitride.

16. The substrate according to claim 1, wherein the first separating layer is composed of one or more layers having an electrical resistivity less than $10^7$ ohm·cm and/or the anti-reflection sublayer is composed of one or more layers having an electrical resistivity less than $10^7$ ohm·cm.

17. The substrate according to claim 1, and wherein the overlayer has a thickness less than or equal to 40 nm.

18. The substrate according to claim 1, wherein the first metallic layer is positioned directly on at least one first subjacent underblocking coating or is directly beneath at least one first superjacent overblocking coating, or the second metallic layer is positioned directly on at least one second subjacent underblocking coating or is directly beneath at least one second superjacent overblocking coating, and wherein at least one first or second overblocking or underblocking coating comprises a metallic, metal nitride and/or oxide layer, based on at least one of the following metals: Ti, V, Mn, Fe, Co, Cu, Zn, Zr, Hf, Al, Nb, Ni, Cr, Mo, Ta, W, or based on an alloy of at least one of said materials.

19. The substrate according to claim 1, comprising the OLED system, having a thickness between 90 and 350 nm and located on top of the electrode that has an electrode surface area with a size greater than or equal to 1×1 cm².

20. The substrate according to claim 19, comprising an upper electrode on top of said OLED system.

21. A method comprising providing a substrate according to claim 1, for forming an OLED device that forms an illumination or backlighting panel.

22. An organic light-emitting device comprising:
a substrate having an index n0 and bearing a first electrode that comprises:
an anti-reflection sublayer having a first optical thickness and having an optical index n1 such that the ratio of n1 to n0 is greater than or equal to 6/5;
a first metallic layer having a second thickness, positioned on the anti-reflection sublayer;
a first separating layer, having a fourth optical thickness, positioned on the first metallic layer and beneath an overlayer, the overlayer for adapting a work function of the electrode and comprising a metal oxide or a metal, having a third thickness, positioned on the first metallic layer, wherein the overlayer is the last layer of the electrode;
a second metallic layer, having an intrinsic electrical conductivity property, and having a fifth thickness, said second layer being positioned between the first separating layer and the overlayer;
the sum of the second and fifth thicknesses of the first and second metallic layers being less than or equal to 40 nm;
an OLED system positioned over the first electrode and that is configured to emit a polychromatic radiation defined at 0° by coordinates (x1, y1) in a CIE XYZ 1931 chromaticity diagram, and
a second electrode, wherein the OLED system is between the first and second electrodes,
wherein the first and fourth optical thicknesses are adjusted so that a first microcavity is formed between the first metallic layer and the second electrode and a second microcavity is formed between the second metallic layer and the second electrode, which first and second microcavities resonate at two different wavelengths in the visible region that are spaced apart by at least about 100 nm to broaden the resonance peaks and form a broadband spectrum in the visible region.

23. An organic light-emitting device incorporating a substrate according to claim 1 and the OLED system positioned over the electrode and that is configured to emit a polychromatic radiation defined at 0° by coordinates (x1, y1) in a CIE XYZ 1931 chromaticity diagram.

24. The organic light-emitting device according to claim 22, wherein said device is configured to emit as the output a spectrum defined at 0° by its colorimetric coordinates (x2, y2) in the CIE XYZ 1931 chromaticity diagram, such that $\sqrt{((x1-x2)^2+(y1-y2)^2)}$ is less than 0.1.

25. The organic light-emitting device according to claim 22, wherein said device is configured to emit as the output a spectrum defined at 0° by its colorimetric coordinates (x2, y2) in the CIE XYZ 1931 chromaticity diagram and wherein the path length, in the CIE XYZ 1931 chromaticity diagram, between the spectrum emitted at 0° and the spectrum emitted at 60°, is less than or equal to 0.1.

26. The organic light-emitting device according to claim 22, wherein the path length, in the CIE XYZ 1931 chromaticity diagram, between the spectrum emitted at 0° and the spectrum emitted at 60°, is less than or equal to 0.05.

27. The organic light-emitting device according to claim 22, wherein said device forms one or more transparent and/or reflective luminous surfaces or an indicating display panel, the system producing uniform light or differentiated luminous zones that are differentiated by guided light extraction in the glass substrate.

28. The organic light-emitting device according to claim 22, wherein the organic light-emitting device is configured to be used:
as exterior luminous glazing, an internal luminous partition or a luminous glazed door or part thereof;
as a luminous roof, a luminous side window or part thereof, an internal luminous partition of a terrestrial, waterborne or airborne vehicle;
as a bus shelter panel, a wall of a display counter or a shop window, a greenhouse wall, or an illuminating tile;
as a shelf or cabinet element, a façade of a cabinet, an illuminating tile, a ceiling, an illuminating refrigerator shelf, or an aquarium wall;
as a display screen, optionally a double screen, or as a television or computer screen, or
a touch screen; or,
as an illuminating mirror for a lighting a bathroom wall or a kitchen work top, or for a ceiling.

29. The substrate according to claim 2, wherein the first optical thickness is less than the fourth optical thickness.

30. The substrate according to claim 10, wherein the first and/or the second contact layer is based on doped or undoped zinc oxide.

31. The substrate according to claim 11, wherein the first and/or the second contact layer is based on doped or undoped zinc oxide.

32. The organic light-emitting device according to claim 23, wherein said device is configured to emit as the output a spectrum defined at 0° by its colorimetric coordinates (x2, y2) in the CIE XYZ 1931 chromaticity diagram, such that $\sqrt{((x1-x2)^2+(y1-y2)^2)}$ is less than 0.1.

33. The organic light-emitting device according to claim 23, wherein said device is configured to emit as the output a spectrum defined at 0° by its colorimetric coordinates (x2, y2) in the CIE XYZ 1931 chromaticity diagram and wherein the path length, in the CIE XYZ 1931 chromaticity diagram, between the spectrum emitted at 0° and the spectrum emitted at 60°, is less than or equal to 0.1.

34. The organic light-emitting device according to claim 23, wherein the path length, in the CIE XYZ 1931 chromaticity diagram, between the spectrum emitted at 0° and the spectrum emitted at 60°, is less than or equal to 0.05.

35. The organic light-emitting device according to claim 22, wherein the metal oxide is optionally doped and comprises chromium oxide, indium oxide, zinc oxide optionally sub-stoichiometric, aluminium oxide, titanium oxide, molybdenum oxide, zirconium oxide, antimony oxide, tin oxide, tantalum oxide or silicon oxide.

36. An organic light-emitting device incorporating a substrate according to claim 1 and the OLED system, wherein the overlayer is in contact with the OLED system.

37. The organic light-emitting device according to claim 22, wherein the overlayer is in contact with the OLED system.

* * * * *